United States Patent [19]

Ikalainen et al.

[11] Patent Number: 5,405,793
[45] Date of Patent: Apr. 11, 1995

[54] METHOD FOR FORMING A LINEAR FIELD EFFECT TRANSISTOR

[75] Inventors: Pertti K. Ikalainen, Allen; Larry C. Witkowski, Plano, both of Tex.

[73] Assignee: Texas Instruments Incorporated, Dallas, Tex.

[21] Appl. No.: 267,270

[22] Filed: Jun. 28, 1994

Related U.S. Application Data

[62] Division of Ser. No. 93,376, Jul. 19, 1993, Pat. No. 5,350,936.

[51] Int. Cl.$^6$ ............................................. H01L 21/265
[52] U.S. Cl. ...................... 437/40; 437/133; 437/912; 148/DIG. 72
[58] Field of Search .............. 437/40, 133, 126, 976, 437/912, 184; 148/DIG. 72

[56] References Cited

U.S. PATENT DOCUMENTS

| | | | |
|---|---|---|---|
| 5,141,879 | 8/1992 | Goronkin et al. | 437/133 |
| 5,151,757 | 9/1992 | Enoki et al. | |
| 5,234,682 | 6/1993 | Tserng | 437/133 |
| 5,254,492 | 10/1993 | Tseng et al. | 437/126 |
| 5,298,441 | 3/1994 | Goronkin et al. | 437/133 |
| 5,322,808 | 6/1994 | Brown et al. | 437/40 |
| 5,350,936 | 9/1994 | Ikalainen et al. | 257/194 |

FOREIGN PATENT DOCUMENTS 2134829  5/1990  Japan ................... 437/133

OTHER PUBLICATIONS

R. E. Williams, et al., "Graded Channel FETs": Improved Linearity and Noise Figure, *IEEE Transactions on Electron Devices*, vol. Ed–25, No. 6, Jun. 1978, pp. 600–605.

S. L. G. Chu, et al., "A Highly Linear MESFET," *IEEE MTT-S Digest*, 1991, pp. 725–728.

P. K. Ikalainen, et al., "Low-Noise Low DC Power Linear FET" *European Microwave Conference Proceedings*, Aug. 1992, pp. 570–575.

P. K. Ikalainen, et al., "High Dynamic Range Microwave FET," *Electronics Letters*, vol. 27, No. 11, May 23, 1991, pp. 945–946.

*Primary Examiner*—Brian E. Hearn
*Assistant Examiner*—Michael Trinh
*Attorney, Agent, or Firm*—Michael K. Skrehot; James C. Kesterson; Richard L. Donaldson

[57] ABSTRACT

In one form of the invention, a field effect transistor is disclosed, the transistor comprising: a channel between a source and a drain, the channel comprising: a first region 22 of a first semiconductor material having a first doping concentration; a second region 20 of a second semiconductor material having a second doping concentration, the second region 20 lying above the first region 22; a third region 18 of the first semiconductor material having a third doping concentration, the third region lying above the second region 20, wherein the first doping concentration is higher than the second and third doping concentrations; and a gate electrode 12 lying above the third region 18, whereby an electrical current flows in the channel primarily in the first region 22 or primarily in the second region 20 by varying a voltage on the gate electrode 12.

15 Claims, 3 Drawing Sheets

METHOD FOR FORMING A LINEAR FIELD EFFECT TRANSISTOR

This is a division of application Ser. No. 08/093,376, filed Jul. 19, 1993, now U.S. Pat. No. 5,350,936.

FIELD OF INVENTION

This invention generally relates to field effect transistors (FETs), and more particularly to FETs with high dynamic range.

BACKGROUND OF INTENTION

Practical amplifiers fall short of ideal amplification due to at least two limiting factors: noise and nonlinearities. Noise added to an amplified signal degrades the "quality" of low-level signals while device nonlinearities distort large-amplitude signals. The useful range over which an active device may amplify power is called the dynamic range. The lowest level signal that can be amplified is governed by internal device noise. The highest level signal that can be amplified is determined by device nonlinearities which cause distortion. In addition to minimizing the noise and maximizing the linearity of the device, it is also desirable to minimize the dc power required to accomplish this. TMs requirement is often expressed in a figure of merit equal to the ratio of the maximum microwave output power (at a specified level of distortion) to the applied DC power. The conventional method of specifying the level of distortion for this figure of merit is called the output intercept point of third order products, or simply OIP3. The OIP3 method applies two input signals separated only slightly in frequency, and of substantially equal, but adjustable, power. A plot is made of both the fundamental frequency output power and the power in the third order intermodulation product versus the input power and a linear extrapolation is made of these two plots. The point where these two extrapolations intersect is the OIP3 amplitude, which is read in dBm from the output power (ordinate) axis.

Attempts to improve amplifier dynamic range fall into at least two categories: circuit techniques and intrinsic improvements in the active device itself. Circuit techniques, such as feed forward or predistortion, are effective but can result in complicated and power consuming circuits. Intrinsic device improvements in the area of microwave FETs have been centered on schemes to make a device with linear transfer characteristics, i.e. an FET with constant transconductance, $g_m = \Delta I_{DS} \Delta V_{GS}$ (transconductance equals the change in drain current divided by the change in gate voltage).

Williams and Shaw (see "Graded Channel FET's: Improved Linearity and Noise Figure", IEEE Transactions on Electron Devices, vol. ED-25, no. 6, pp 600–605, June 1978) in their theoretical study of the subject emphasized using a special doping profile to maintain a constant transconductance at all gate voltages. The structure used by Chu, et al (see "A Highly linear MESFET", IEEE-MT-Intentional Microwave Symposium Digest, pp 735–728, 1991), while achieving constant $g_m$, is very complex and the gate region is difficult to fabricate reproducibly using conventional etching techniques. Applicants have previously disclosed a simpler structure than that of the aforementioned prior art for obtaining similar results (See Ikalainen and Witkowski, "High Dynamic Range Microwave FET", Electronics Letters, vol. 27. no. 11, pp 945–6, May 23, 1991).

SUMMARY OF THE INVENTION

The prior art has concentrated on maintaining a linear transconductance versus gate voltage characteristic in attempts to fabricate transistors with highly linear operating characteristics, and hence high dynamic range. A substrate material structure is disclosed herein which uses a plurality of dopant layers, one of which (typically lightly doped indium gallium arsenide, InGaAs,) has higher electron mobility and sainted velocity than highly doped GaAs. This permits a precise control of the transconductance characteristic of an FET fabricated on this substate such that the transconductance is slightly non-linear with respect to gate voltage. The controlled transconductance nonlinearity of this invention compensates for the inherently nonlinear output conductance of GaAs field effect transistors. While prior art structures have occasionally displayed a small degree of this desired nonlinearity, its physical origin does not appear to be predictable or well understood in those structures. In contrast, the structure described herein produces a desired transconductance nonlinearity that may be enhanced or diminished through choices in epitaxial layer design.

In one form of the invention, a field effect transistor is disclosed, the transistor comprising: a channel between a source and a drain, the channel comprising: a first region of a first semiconductor material having a first doping concentration; a second region of a second semiconductor material having a second doping concentration, the second region lying above the first region; a third region of the first semiconductor material having a third doping concentration, the third region lying above the second region, wherein the first doping concentration is higher than the second and third doping concentrations; and a gate electrode lying above the third region, whereby an electrical current flows in the channel primarily in the first region or primarily in the second region by varying a voltage on the gate electrode.

In another form of the invention, a field effect transistor is disclosed, the transistor comprising: a substrate; a first channel layer lying above the substrate, the first channel layer being composed of a first semiconductor material; a second channel layer lying above the first channel layer, the second channel layer being composed of a second semiconductor material; a third channel layer lying above the second channel layer, the third channel layer being composed of the first semiconductor material; and a gate electrode above the third channel layer; wherein the second semiconductor material has a narrower bandgap than the first semiconductor material, and further wherein the first channel layer has a higher doping concentration than the second and third channel layers.

In still another form of the invention, a method for forming a field effect transistor is disclosed, the method comprising the steps of: forming a channel between a source and a drain, the forming of the channel comprising the steps of: forming a first region of a first semiconductor material having a first doping concentration; forming a second region of a second semiconductor material having a second doping concentration above the first region; forming a third region of the first semiconductor material having a third doping concentration above the second region, wherein the first doping concentration is higher than the second and third doping concentrations; and forming a gate electrode above the third region, whereby an electrical current flows in the channel primarily in the first region or primarily in the second region by varying a voltage on the gate electrode.

An advantage of the invention is that it produces a desired nonlinearity in a transistor in a controllable and reproducible way. In contrast to prior art structures, the nonlinearity of the transconductance characteristic of the invention described herein may be altered in a predictable manner by changing such parameters as layer thickness, doping, or material composition. Additionally, the embodiment described herein has exhibited current conduction in a two-dimensional electron gas at a heterointerface. This is accomplished in a structure that is more easily fabricated than the traditional inverted High Electron Mobility Transistor that is known in the art because it does not rely on GaAs-over-AlGaAs epitaxy.

BRIEF DESCRIPTION OF THE DRAWINGS

Corresponding numerals and symbols in the different figures refer to corresponding parts unless otherwise indicated.

DETAILED DESCRIPTION OF PREFERRED EMBODIMENTS

Figure 2A:
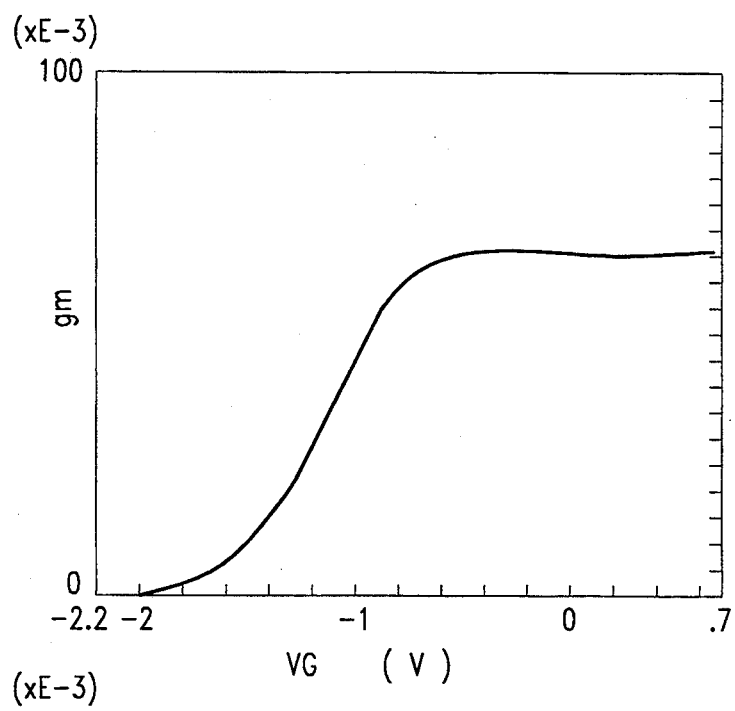
FIG. 2a is a graph of the transconductance of a prior art transistor.
Figure 2B:
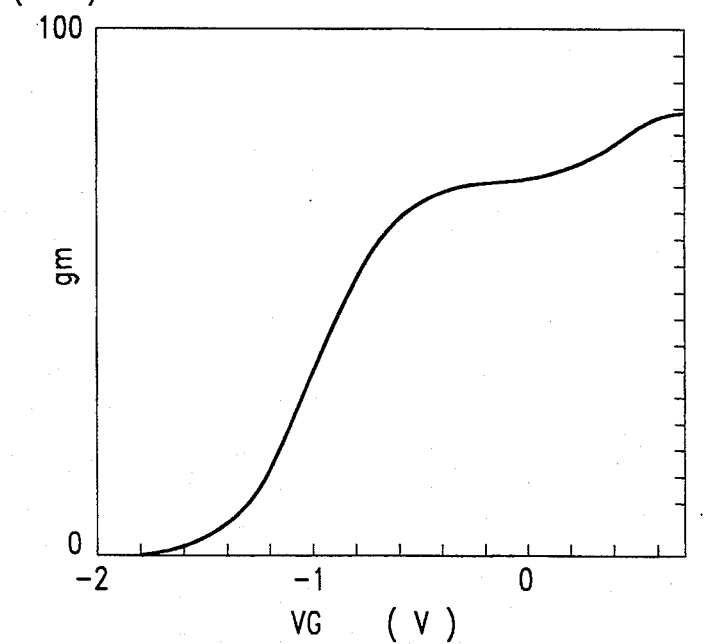
FIG. 2b is a graph of the transconductance of a first preferred embodiment transistor.

Applicant's studies show that, considering nonlinearities up to third-order, it is desirable to have a device with only approximately constant transconductance, but that ideally the transconductance vs. gate voltage characteristic should have a slightly positive curvature, i.e., the second derivative of $g_m$ with respect to gate voltage should be positive. This allows cancellation of distortion to occur between nonlinear output conductance and nonlinear $g_m$. Cancellation has been shown to be an effective solution to the problematic nonlinearity of a transistor's output conductance (see Ikalainen et al, "Low-Noise, Low DC Power Linear FET", European Microwave Conf Proc, August 1992, pp 570–575). However, while GaAs low-high doping profiles can exhibit a transconductance characteristic with small positive curvatures, there is not an easy or predictable way to control the degree of curvature. FIGS. 2(a) and 2(b) are drawn from Applicant's results comparing a side-by-side fabrication of a prior art design with a preferred embodiment FIG. 2(a) shows that the transconductance of the prior art design flattens more than desired at the higher gate voltages (−0.5 V to 0.5 V), while a first preferred embodiment transistor has a second peak in the same voltage range.

Figure 1:
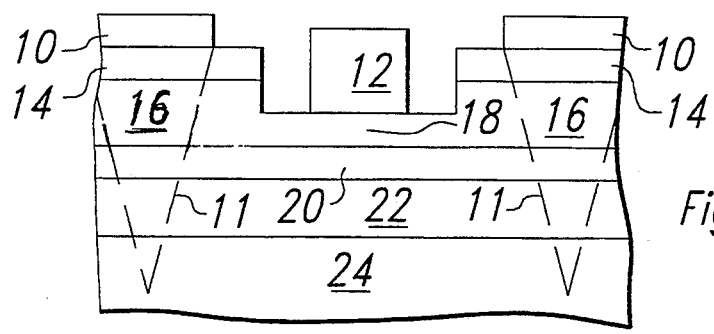
FIG. 1 is a cross-sectional view of a preferred embodiment device.

A preferred embodiment that addresses this shortcoming of the prior art, and produced the transconductance trace of FIG. 2b, will be described with reference to FIG. 1 and the Table, which show a material structure that allows a precise control over transconductance shape versus gate voltage to produce highly linear microwave FET amplifiers.

TABLE

| Element | Material | Approx. Doping (carriers/cm$^3$) | Approx. Thickness (Å) |
| --- | --- | --- | --- |
| 10 | Contact metal | NA | 4000 |
| 12 | Gate metal | NA | 5000 |
| 14 | Source/drain n$^+$ GaAs | 1 × 10$^{18}$ | 300–1000, preferably 500 |
| 16 | n$^-$ GaAs | 1 × 10$^{16}$ to 1 × 10$^{17}$, preferably 5 × 10$^{16}$ | 500–2500, preferably 2000 |
| 18 | Etched n$^-$ GaAs | 1 × 10$^{16}$ to 1 × 10$^{17}$, preferably 5 × 10$^{16}$ | 100–500, preferably 250 |
| 20 | n$^-$ In$_x$Ga$_{1-x}$As, where 0.10 < x < 0.20, preferably x = 0.17 | 1 × 10$^{16}$ to 1 × 10$^{17}$, preferably 5 × 10$^{16}$ | 25–150, preferably 100 |
| 22 | n$^+$ GaAs | 1 × 10$^{18}$ | 100–500, preferably 300 |
| 24 | Semi-insulating substrate | Undoped | 625 um |

The semi-insulating substrate 24 is preferably GaAs, but other materials such as InP and Si may also be used. The dopant is typically Si, but may alternatively be an element such as Sn or Pb, for example. The Schottky gate 12 is typically 0.5 um or less in length, and is typically a composite layer of Ti/Pt/Au. The contact metal 10, typically a composite layer of AuGe/Ni/Au, forms an ohmic contact to the source and drain 14, and is typically alloyed so that contact metal 10 spikes through (shown in FIG. 1 by dashed line 11) and thereby contacts channel layers 18, 20 and 22. An important aspect of the preferred embodiment is the low (18)-low (20)-high (22) nature of the channel doping profile. The thickness and doping concentration of these doping layers effects the desired nonlinear shape of the FET transconductance versus gate voltage as described hereinbelow.

In operation, the embodiment transistor has a voltage applied between the drain and source contacts 10 and a voltage applied to the gate electrode 12. A channel comprising first channel layer 22, second channel layer, 20, and third channel layer 18 may be made conductive or non-conductive by selecting the level of voltage applied to gate electrode 12. It is convenient to describe the operation of the transistor as it changes from a condition of pinch-off (i.e. a large negative gate voltage and non-conductive channel) to a fully open channel (i.e. a gate voltage close to 0 V and a fully conductive channel). As the gate voltage moves from large negative voltages toward 0 V, the transistor operation goes from pinchoff (very low transconductance) toward a fully open channel. The initial source-drain current is earned by the highly doped first channel layer 22 and the transconductance reaches a fairly constant value (at around $V_G = -0.5$ V) as can be seen in both FIG. 2(a) and FIG. 2(b). However, at higher gate voltages, approaching and then exceeding 0 Volts, a portion of the source-drain current moves into the lightly doped second channel n$^-$InGaAs layer 20 in the embodiment transistor. Since the InGaAs second channel layer 20 has higher electron mobility and saturated velocity than does the underlying GaAs first channel layer 22, an increase, or second peak (see FIG. 2b for $V_g > V$), in transconductance can be induced to occur. This can be compared to the characteristic, shown in FIG. 2a of a prior art GaAs FET fabricated on a standard low-high doping profile substrate without the InGaAs layer.

Figure 3A:
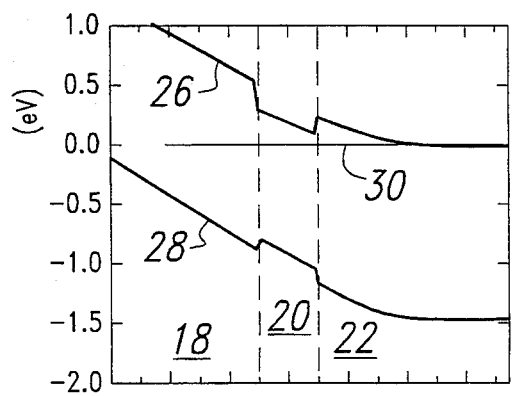
FIG. 3a is a band diagram simulation of a portion of a first preferred embodiment transistor at a gate bias voltage of −0.5 V.
Figure 3B:
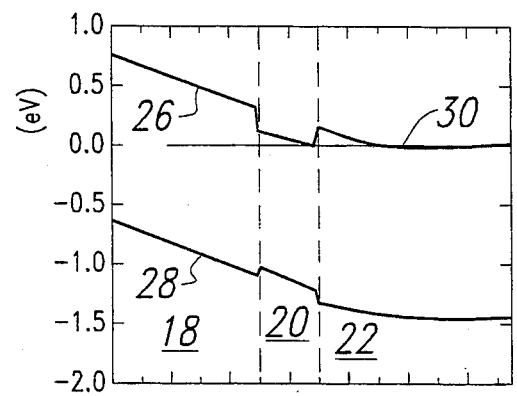
FIG. 3b is a band diagram simulation of a portion of a first preferred embodiment transistor at a gate bias voltage of 0 V.

A more graphical description of the operation of the embodiment transistor may be had by referring to FIGS. 3a, 3b, 4a and 4b. FIGS. 3a and 3b are simulations of the band diagram of the three channel layers 18, 20, and 22 (demarcated by dashed vertical lines) under a gate bias of $-0.5$ V (FIG. 3a) and 0 V (FIG. 3b). In FIG. 3a, the regions of the band diagram denoted 18, 20 and 22 represent the GaAs third channel layer, the InGaAs second channel layer, and the highly doped GaAs first channel layer, respectively. Comparison of FIGS. 3a and 3b reveal the bending of the conduction 26 and valence 28 bands and the shifting of the Fermi level 30 under the change in gate bias from $-0.5$ V to 0 V.

Figure 4A:
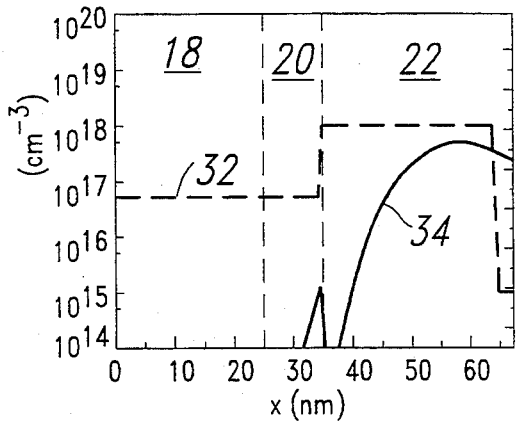
FIG. 4a is a simulation graph showing the doping and carrier concentration of a portion of a first preferred embodiment transistor at a gate bias voltage of −0.5 V.
Figure 4B:
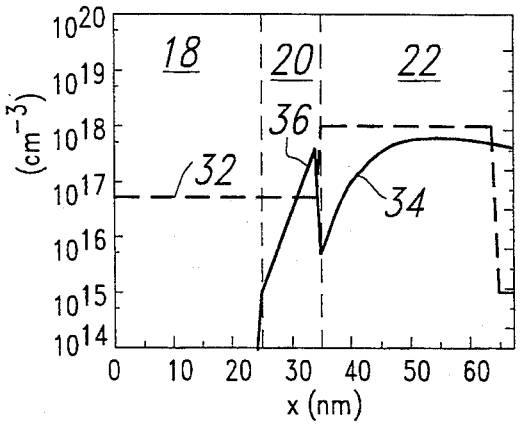
FIG. 4b is a simulation graph showing the doping and carrier concentration of a portion of a first preferred embodiment transistor at a gate bias voltage of 0 V.

FIGS. 4a and 4b are companion simulation diagrams to FIGS. 3a and 3b and show the doping density, or doping concentration, 32 and the carrier concentration 34 in layers 18, 20 and 22 under $-0.5$ V (FIG. 4a) and 0 V (FIG. 4b) gate bias. Inspection of FIG. 4a reveals that a large majority of carders (and thus current) reside in the highly doped GaAs layer 22, as dictated by the Fermi level 30 in FIG. 3a. However, at 0 V gate bias in FIG. 4b, a large spike 36 appears in the InGaAs layer 20. Inspection of FIG. 3b shows that the Fermi level 30 is at or above the conduction band dip at the heterojunction between layers 20 and 22. Thus, electrons accumulate in the dip and form an electron gas, as is seen in AlGaAs/GaAs High Electron Mobility Transistors (HEMTs). So, in addition to the bulk InGaAs layer having higher electron mobility and saturated velocity than does GaAs, the interface between the materials has particularly enhanced carrier transport properties as well. The second peak in transconductance in FIG. 2b results from the applied gate voltage on the transistor reaching a level where conduction begins to take place not only in layer 22, but also in layer 20 and at the interface between layers 20 and 22.

Control over the scale or size of the second transconductance peak is possible by varying the second channel layer 20 thickness, doping concentration, or In-Ga mole fraction. In general, if the second channel layer 20 is made to be thicker, the second peak in transconductance will be enhanced. Similarly, if the doping or In mole fraction is increased, the peak is expected to be enhanced. However, there are practical upper limits to these parameters. The In mole fraction and thickness of the InGaAs layer are limited to approximately 0.20 to 0.22 and 200 to 250 Å, respectively. Thicker layers are more susceptible to defects induced by the lattice mismatch at the GaAs/nGaAs boundary. Similarly, as the mole fraction of In in InGaAs in increased (from 17%), its lattice constant differs more from that of GaAs, and an unacceptably strained InGaAs layer results. In general, the doping of the InGaAs layer is kept low to preserve the overall low-low-high doping profile and hence the advantageous current transport that results in the second transconductance peak described hereinabove.

Figure 5A:
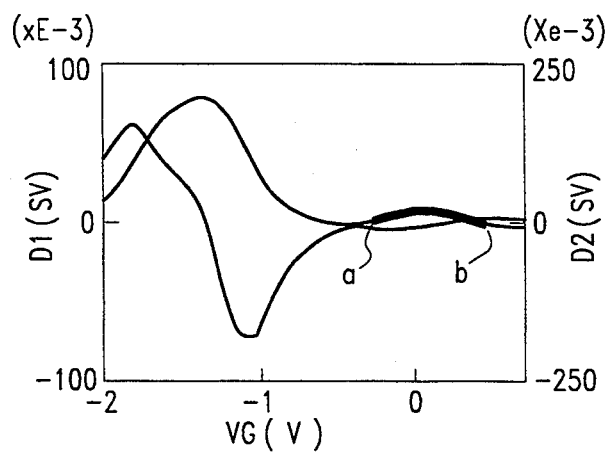
FIG. 5a is a graph of the second derivative of the transconductance vs. gate voltage characteristic of a prior art transistor.
Figure 5B:
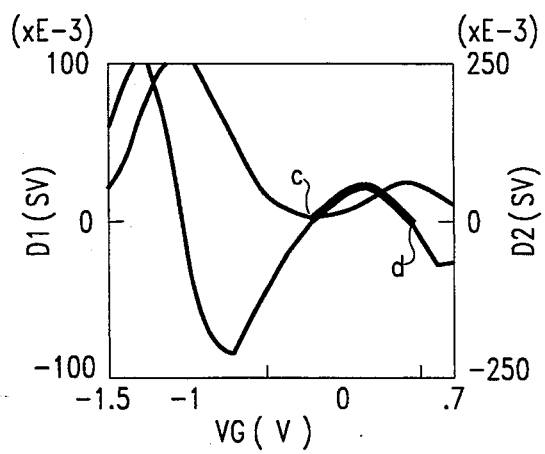
FIG. 5b is a graph of the second derivative of the transconductance vs. gate voltage characteristic of a first preferred embodiment transistor.

FIGS. 5a and 5b are plots of the second derivative of the transconductance vs. gate voltage characteristic of the prior art low-high device (FIG. 5a) and the first preferred embodiment low-low-high device (FIG. 5b). While the darkened line section a-b of the trace in FIG. 5a indicates that the second derivative is approximately zero, the darkened line section c-d of the trace of FIG. 5b is decidedly positive over a range of gate voltages from slightly below 0 V to almost 0.5 V. Applicants have found that a device with this characteristic is very effective in cancelling the nonlinearity of the output conductance of the device. This leads to a device capable of more linear operation and hence a greater dynamic range than with the devices described in an the prior art.

Figure 6:
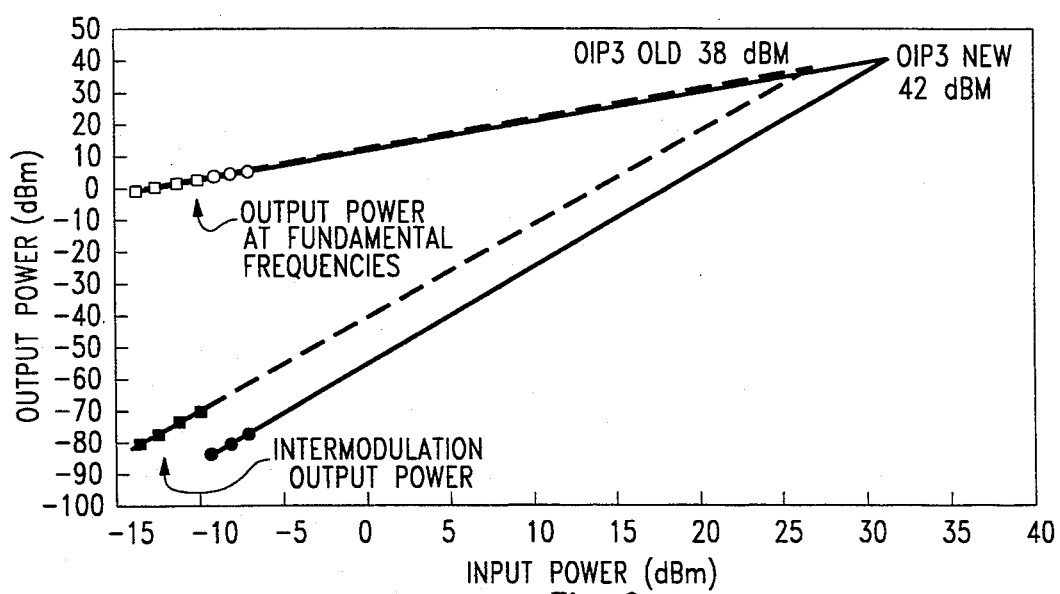
FIG. 6 is a graph showing the OIP3 of prior art and preferred embodiment devices.

In a reduction to practice, microwave tests were performed at 10 GHz on both the prior art and the first preferred embodiment structure. OIP3 results, shown in FIG. 6, were 37 dBm for the prior art and 42 dBm for the embodiment device. Although the new design was not specifically optimized for low noise, the minimum noise figure of the two designs were the same at approximately 1.7 dB. Thus the dynamic range was increased a significant 5 dB with the embodiment transistor.

As briefly discussed hereinabove in reference to FIGS. 3a, 3b, 4a and 4b, an advantage of the low-low-high doping profile structure is that it has the features of an inverted high-electron-mobility transistor (HEMT). A HEMT is generally a transistor comprised of two different semiconductors of differing bandgaps. In a standard HEMT, a wide-bandgap highly-doped layer is formed on top of a lightly-doped layer having a narrower bandgap. The band discontinuity between the layers promotes the formation of a potential well at the interface. A two-dimensional electron gas can be formed in the well that provides superior carrier transport qualifies than does the surrounding bulk semiconductor. An inverted HEMT is characterized by a lightly-doped, low-bandgap, material on top of highly-doped wider-bandgap material. The usual inverted HEMT uses aluminum gallium arsenide (AlGaAs) as the bottom layer, with an overgrowth layer of GaAs. Though commonly done, the growth of GaAs on AlGaAs can result in a GaAs layer having a high defect density, which in turn results in a transistor with inferior performance characteristics. In contrast, the growth of InGaAs on a GaAs generally results in lower defect densities. Using GaAs for the highly-doped wide-bandgap layer and InGaAs for the lightly-doped narrow-bandgap layer, as in the preferred embodiment discussed hereinabove, makes the structure very reproducible and gives the desired transfer characteristics for linear amplification.

While this invention has been described with reference to illustrative embodiments, this description is not intended to be construed in a limiting sense. This invention can be applied to other material systems with varying mobilities such as Si/Ge, InP/InGaAs and so on. Further, it may be appreciated that the preferred embodiment transistor described hereinabove may be used in applications where MESFETs or HEMTs have traditionally been used, for example, low-noise microwave receiver amplifiers, power amplifiers, switches, phase shifters, and the like.

Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a field effect transistor comprising the steps of:
  forming a channel between a source and a drain, the forming of said channel comprising the steps of:
    forming a first region of a first semiconductor material having a first doping concentration;
    forming a second region of a second semiconductor material having a second doping concentration above said first region;
    forming a third region of said first semiconductor material having a third doping concentration above said second region, wherein said first doping concentration is higher than said second and third doping concentrations; and
  forming a gate electrode above said third region, whereby an electrical current flows in said channel primarily in said first region or primarily in said second region by varying a voltage on said gate electrode.

2. The method of claim 1 wherein said second semiconductor material has a narrower bandgap than said first semiconductor material.

3. The method of claim 2 wherein said second semiconductor material has a higher electron mobility and saturated velocity than said first semiconductor material.

4. The method of claim 1 wherein said second semiconductor material is InGaAs and said first semiconductor material is GaAs.

5. The method of claim 1 wherein said substrate is composed of GaAs, said first semiconductor material is doped to a concentration of approximately $1 \times 10^{18}$ cm$^{-3}$, said second channel layer is doped to a concentration in the rage of approximately $1 \times 10^{16}$ to $1 \times 10^{17}$ cm$^{-3}$, and said third channel layer is doped to a concentration in the rnage of approximately $1 \times 10^{16}$ to $1 \times 10^{17}$ cm$^{-3}$.

6. A method for forming a field effect transistor, comprising the steps of:
  providing a substrate;
  forming a first channel layer over said substrate, said first channel layer composed of a first semiconductor material;
  forming a second channel layer over said first channel layer, said second channel layer composed of a second semiconductor material;
  forming a third channel layer over said second channel layer, said third channel layer composed of said first semiconductor material; and
  forming a gate electrode over said third channel layer;
  wherein said second semiconductor material has a narrower bandgap than said first semiconductor material, and further wherein said first channel layer has a higher doping concentration than said second and third channel layers.

7. The method of claim 6 wherein said first channel layer and said second channel layer are formed to contact one another along an interface, and wherein a portion of a current is transferred across said layers by a two-dimensional electron gas at said interface.

8. The method of claim 6 further comprising the steps of forming drain and source contacts to said first, second and third channel layers, wherein said transistor is operable with a drain current from said drain contact to said source contact, the level of said drain current being dependent upon a voltage between said gate electrode and said source contact, and further wherein a second derivative of a change in drain current divided by a change in gate voltage is positive at a gate voltage of approximately 0 Volts.

9. The method of claim 8 wherein said second channel layer is formed to be approximately 100 Å in thickness and wherein said second derivative has a positive first value.

10. The method of claim 9 wherein said second channel layer is formed to be greater than approximately 100 Å in thickness, and wherein said transistor is characterized by a second derivative having a positive second value, wherein said positive second value is greater than said positive first value.

11. The method of claim 8 wherein said second channel layer is doped to have a doping concentration of approximately $5 \times 10^{16}$ cm$^{-3}$, and wherein said second derivative has a positive first value.

12. The method of claim 11 wherein said second channel layer is doped to have a doping concentration greater than approximately $5 \times 10^{16}$ cm$^{-3}$, and wherein said transistor is characterized by a second derivative having a positive second value, wherein said positive second value is greater than said positive first value.

13. The method of claim 6 wherein said second semiconductor material is formed of InGaAs and said first semiconductor material is formed of GaAs.

14. The method of claim 8 wherein said second channel layer is formed of In$_x$Ga$_{1-x}$As, wherein x is approximately 0.17, and wherein said second derivative has a positive first value.

15. The method of claim 14 wherein said second channel layer is formed of In$_x$Ga$_{1-x}$As, wherein x is greater than approximately 0.17, and wherein said transistor is characterized by a second derivative having a positive second value, wherein said positive second value is greater than said positive first value.

* * * * *